United States Patent
Chen et al.

(10) Patent No.: US 7,505,828 B2
(45) Date of Patent: Mar. 17, 2009

(54) CARRIER TRANSPORTATION MANAGEMENT SYSTEM AND METHOD FOR INTERNAL BUFFER PROCESS TOOLS

(75) Inventors: Ren-Hour Chen, Tainan (TW); Kuo-Hua Wang, Kaohsiung (TW); Chien-Hsiung Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/457,645

(22) Filed: Jul. 14, 2006

(65) Prior Publication Data

US 2008/0015723 A1    Jan. 17, 2008

(51) Int. Cl.
  *G06F 19/00* (2006.01)
(52) U.S. Cl. .................. 700/101; 700/97; 700/99; 700/100
(58) Field of Classification Search ............... 700/97, 700/99, 100, 101
  See application file for complete search history.

(56) References Cited

U.S. PATENT DOCUMENTS

| | | | |
|---|---|---|---|
| 5,455,894 A | 10/1995 | Conboy et al. | |
| 5,838,566 A | 11/1998 | Conboy et al. | |
| 5,924,833 A | 7/1999 | Conboy et al. | |
| 6,035,245 A | 3/2000 | Conboy et al. | |
| 6,108,585 A | 8/2000 | Ryan et al. | |
| 6,157,866 A | 12/2000 | Conboy et al. | |
| 6,308,107 B1 | 10/2001 | Conboy | |
| 6,431,814 B1 | 8/2002 | Christensen et al. | |
| 6,449,520 B1 * | 9/2002 | Lin et al. | 700/97 |
| 6,580,967 B2 | 6/2003 | Jevtic et al. | |
| 6,662,076 B1 | 12/2003 | Conboy et al. | |
| 6,684,121 B1 | 1/2004 | Lu et al. | |
| 6,687,563 B1 | 2/2004 | Wang et al. | |
| 6,778,879 B2 | 8/2004 | Chang et al. | |
| 7,024,275 B2 | 4/2006 | Lai | |
| 2006/0070014 A1 | 3/2006 | Liu et al. | |

OTHER PUBLICATIONS

Gino Crispieri, "Automation Overview", PowerPoint presentation, International Sematech Manufacturing Initiative, 15 pages.

(Continued)

*Primary Examiner*—Michael D Masinick
(74) *Attorney, Agent, or Firm*—Haynes and Boone, LLP

(57) ABSTRACT

System and method for carrier transportation management in a wafer fabrication facility ("fab") are described. In one embodiment, the fab comprises a process tool having an internal buffer for storing a plurality of carriers each containing a wafer lot and a load port for loading wafer lots into and out of the internal buffer and the method comprises determining a relative priority between a first wafer lot, which has been processed by the process tool and is stored in the internal buffer, and a second wafer lot, which is to be transported to the process tool for processing thereby; and, responsive to a notification from the process tool that the load port is available, unloading the first wafer lot from the internal buffer via the load port if the first wafer lot has been determined to have a higher priority than the second wafer lot, and transporting the second wafer lot to the process tool and loading the second wafer lot into the internal buffer via the load port if the second wafer lot has been determined to have a higher priority than the first wafer lot.

11 Claims, 3 Drawing Sheets

OTHER PUBLICATIONS

Len Foster, "300mm Wafer Factory Automation and the Logistics Infrastructure Challenge", Montgomery Research, Future Fab Intl., vol. 11, Texas Instruments Incorporated, Jun. 29, 2001, 11 pages.
M. Austen et al., "Automated Process Job Execution wition a 300 mm CIM Environment", Montgomery Research, Future Fab Intl., vol. 8, Jul. 1, 2000, 19 pages.
Ken Van Antwerp, "Automation in a Semiconductor Fab", Semiconductor International, Dec. 1, 2004, 6 pages.
"300 mm Equipment Base Software Functionality Requirements . . . ", International SEMATECH, 96 pages.
"AMHS Equipment", Dec. 1, 1998, 4th Selete 300mm PEPA, 1 page.
Unpublished U.S. Appl. No. 10/132333 filed Apr. 25, 2002.

* cited by examiner

CARRIER TRANSPORTATION MANAGEMENT SYSTEM AND METHOD FOR INTERNAL BUFFER PROCESS TOOLS

BACKGROUND

The manufacture of semiconductor devices involves the performance of a series of process steps using a variety of high tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process.

Automated material handling systems ("AMHS") are applied to wafer fabs to carry out the automated functions more efficiently, consistently, and safely than can be done via manual means. While growth in wafer size from 200 mm to 300 mm has rendered the fabrication process more economical in some respects, it has also placed additional demands on the process. Such demands include the necessity for cross-floor and cross-phase transportation and increased transportation volume, the combination of which often results in traffic jams. Additionally, the investment in the AMHS hardware is large.

300 mm process tools can be divided into two main categories, including fixed buffer process tools and internal buffer process tools. A fixed buffer process tool has only fixed load ports for receiving wafer carriers, such as front opening unified pods ("FOUPs") and no internal buffer for carrier storage; consequently, wafers are loaded and unloaded directly from a carrier transported via an overhead transport ("OHT") system at the load ports for processing by a fixed buffer process tool. In contrast, an internal buffer process tool includes locations within the tool in which to store carriers, each of which contains a portion of a batch, or a "lot", prior or subsequent to processing the wafers, not including the load ports. Internal buffer tools are thus capable of implementing continuous batch processing. For example, assuming a first batch comprising one or more lots is being processed by a process unit of the tool, a second batch comprising one or more lots can be stored in the buffer thereof. Subsequently, the AMHS determines whether one of the load ports of the tool is available and, if so, sends a carrier containing a lot comprising a portion of a third batch to the tool. This may result in a conflict, however, if by the time the carrier containing the third batch lot arrives at the previously available load port, a carrier containing a lot of the second batch is unloading from the buffer via the load port, causing a conflict at the load ports. Upon the occurrence of such a conflict, the carrier containing the third batch lot will be returned to the location from which it originated, as unloading a carrier from a tool generally has a higher priority than loading a carrier to a tool. Currently, it is not possible to determine whether such a conflict will occur until the carrier containing the third batch lot arrives at the tool via the OHT system.

BRIEF DESCRIPTION OF THE DRAWINGS

The features and advantages of a carrier transportation management system and method for internal buffer process equipment according to the present invention will be more clearly understood from the following description taken in conjunction with the accompanying drawings in which like reference numerals designate similar or corresponding elements, regions, and portions, and in which.

DETAILED DESCRIPTION

Figure 1:
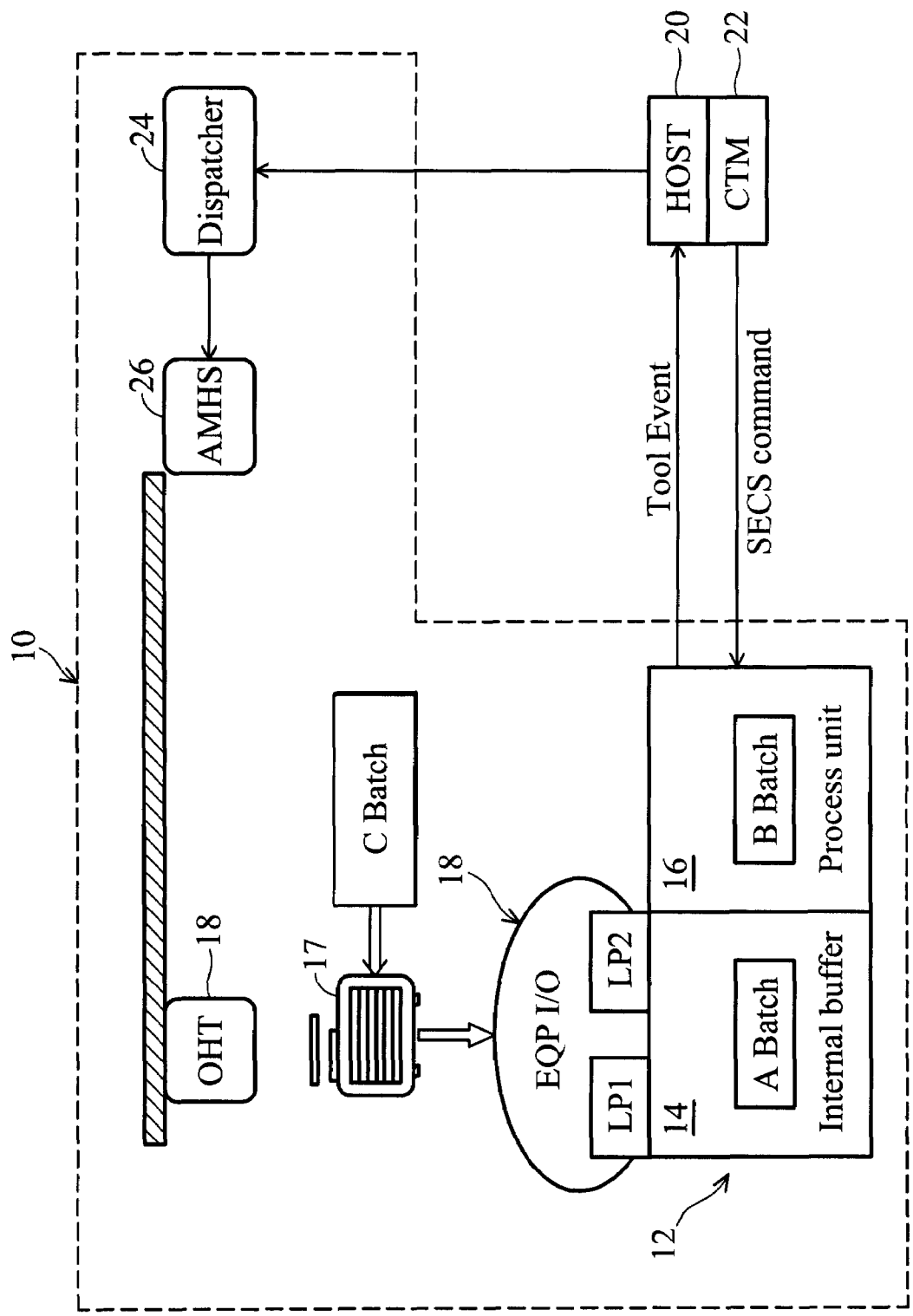
FIG. 1 is a block diagram illustrating control flow for carrier delivery to a process tool in a wafer fab in accordance with one embodiment using a carrier transport management ("CTM") system.

FIG. 1 illustrates control flow for carrier delivery in a fab 10 in accordance with one embodiment. In the illustrated embodiment, the fab 10 includes a process tool 12 comprising an internal buffer 14 for storing a batch of wafers prior or subsequent to processing thereof by a process unit 16. The process tool 12 further includes load ports LP1, LP2, collectively designated and referred to as equipment I/O ("EQP I/O") 18. As further illustrated in FIG. 1, a first batch ("A Batch") of wafers comprising one or more lots is stored in the internal buffer 14. A second batch ("B Batch") of wafers comprising one or more lots is currently being processed by the processing unit 16. A lot comprising a portion of a third batch ("C Batch") of wafers disposed within a carrier 17 may be being transported to the tool 12 via an OHT system 18. It will be assumed for the sake of example that all of the A Batch wafers have already been processed by the processing unit 16 and that they are being stored in the internal buffer 14 prior to being unloaded from the tool 12 via the load ports LP1, LP2.

A host system 20 is operationally connected to the tool 12 to receive tool event notifications, such as load port status ("LP Status") notifications, therefrom and to issue operational commands, such as to unload a carrier from the internal buffer thereof ("CarrierOut"), to the tool 12. In operation, when one of the load ports LP1, LP2, is available, the tool 12, and more specifically, the EQP I/O 18, sends an LP Status notification to the host 20 indicative of the status of the load port(s).

In accordance with features of an embodiment, and as will be described in greater detail below with reference to FIG. 2, a carrier transportation management ("CTM") system 22 residing on the host 20 makes a determination based on manufacturing execution system ("MES") information, as well as EQP I/O information, as to whether to send a carrier (e.g., carrier 17) containing a lot of a new batch (e.g., C Batch) to the tool 12 or to unload a carrier comprising a portion of a batch (e.g., A Batch) from the tool 12 prior to sending another carrier thereto. This determination will prevent a conflict from occurring at the load port(s) LP1, LP2, of the tool 12. If a determination is made to dispatch a carrier to the tool 12, the host 20 notifies a dispatcher 24, which in turn instructs an AMHS 26 to initiate transport of the designated batch to the tool 12 via the OHT system 18.

Figure 2:
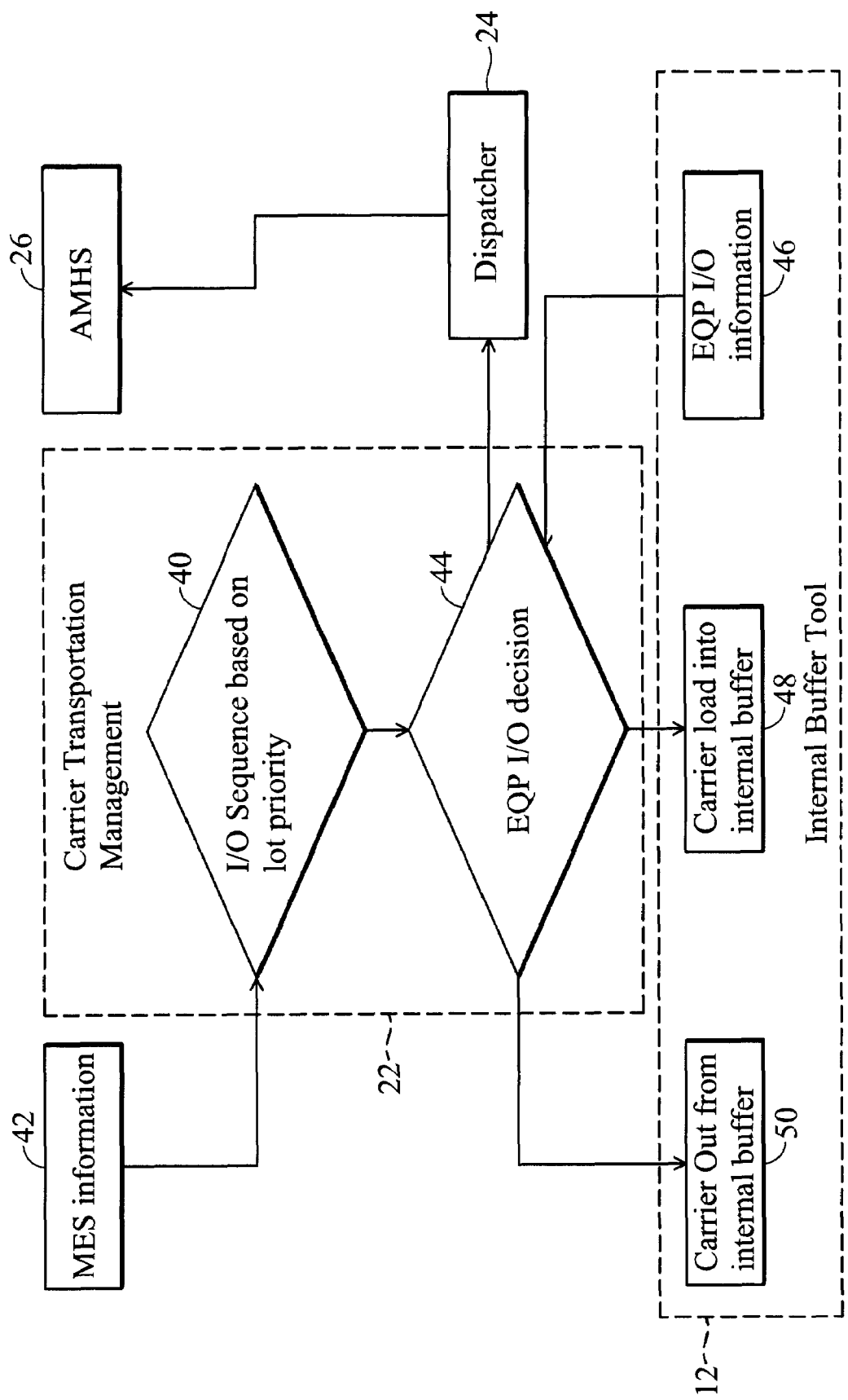
FIG. 2 is a flow diagram illustrating a method implemented by the CTM system of FIG. 1 in accordance with one embodiment.

FIG. 2 illustrates a method of implementing the CTM 22 in accordance with one embodiment. As shown in FIG. 2, in a first step 40, the CTM 22 receives MES information 42 comprising lot priority information that is used to determine how lots, or batches, should be sequenced based on the relative priorities thereof. For example, assume a first batch ("X Batch") comprising three lots (X01, X02, X03) has been processed and is being stored in the internal buffer of the tool prior to unloading and that a second batch ("Y Batch") comprising three lots (Y01, Y02, Y03) needs to be loaded onto the tool. Assume further that the lot X01 has been loaded at the first load port, that the lot X02 wants to load at the second load port, and that the lot Y01 wants to unload at the second load port. In this case, the CMT 22 will compare the priorities of the lots X02 and Y01 to determine whether to load the lot X02 first or to unload the lot Y01 first. If the lot Y01 has a higher priority, it will be unloaded before the lot X02 is loaded. In contrast, if the lot X02 has a higher priority, it will be loaded before the lot Y01 is unloaded. It should be noted that, in the first case, subsequent to the unloading of the lot Y02 and prior to the loading of the lot X02, upon the availability of the second load port, it is likely that the lot Y02 will be ready to be unloaded, such that a comparison will need to be made as to the relative priorities of the lots X02 and Y02. Similarly, in the second case, subsequent to the loading of the lot X02 and prior to the unloading of the lot Y01, upon the availability of the second load port, it is likely that the lot X03 will be ready to be loaded, such that a comparison will need to be made as to the relative priorities of the lots X03 and Y02.

It will be recognized that the foregoing example is founded on an underlying assumption that there is sufficient space within the internal buffer to accommodate the loading of the lot X02 prior to the unloading of the lot Y01, should that be the case. In this manner, the CTM 22 is able to determine the optimum order in which to load and unload carriers at the process tool 12. In a second step 44, the I/O sequencing information developed in step 42 is considered along with EQP I/O information 46 (i.e., whether a load port is actually available) to determine whether to signal the dispatcher 24 to cause the AMHS 26 to send a carrier to the tool 12 and command the tool to load the received lot into the internal buffer (step 48) or to unload the lot stored in the internal buffer thereof (step 50).

Figure 3:
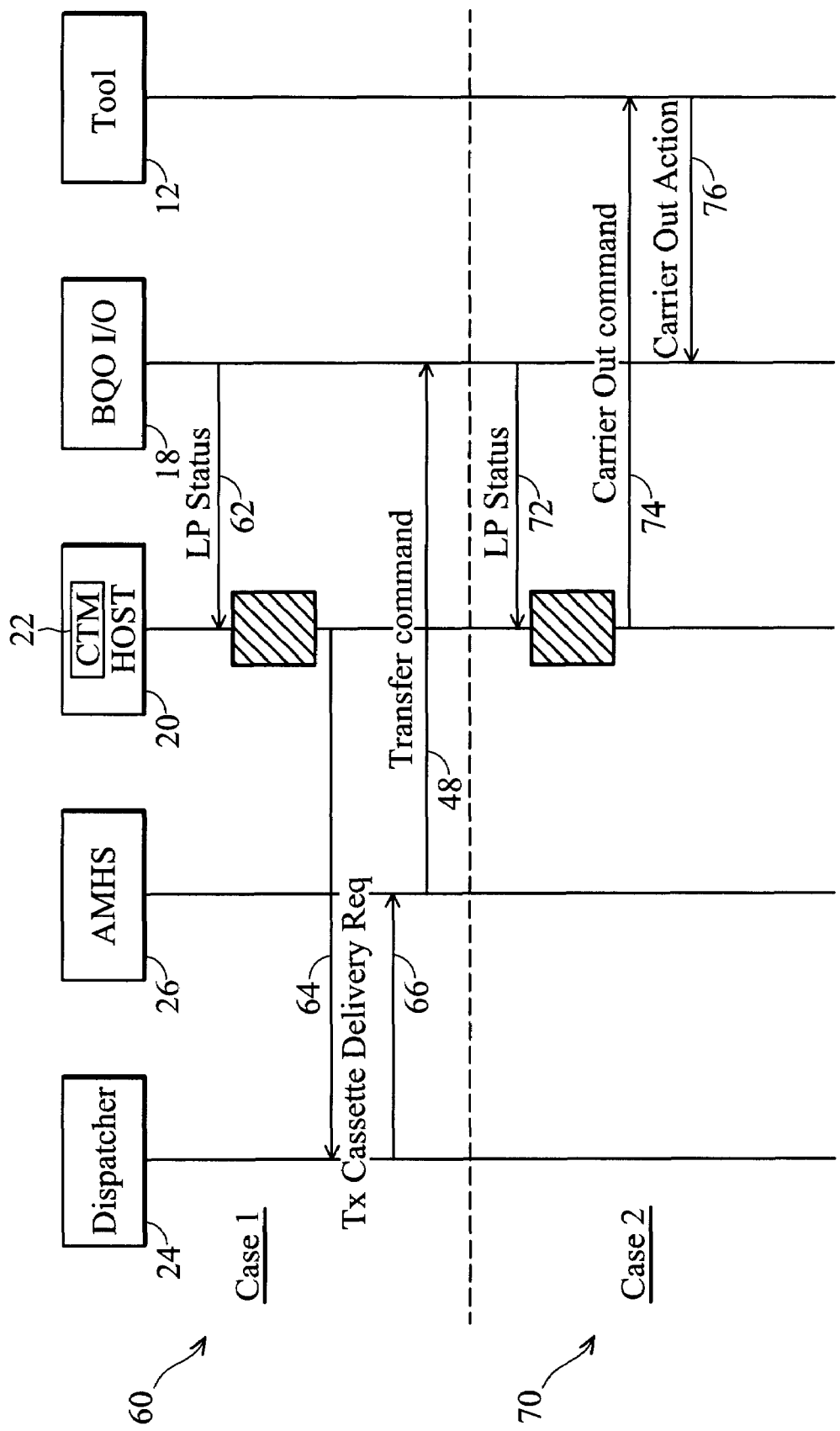
FIG. 3 illustrates comparative operation of the CTM system of FIG. 1 in response to two sets of circumstances in the fab.

FIG. 3 illustrates comparative operation of the CTM system of FIG. 1 in response to two sets of circumstances in the fab 10. In a first case, referred to as "Case 1" and designated by a reference numeral 60, the EQP I/O 18 sends an LP Status notification 62 to the host 20 comprising the CTM 22 indicating that at least one of the load ports LP1, LP2, is available. The CTM 22 evaluates the status of the EQP I/O 18 in the manner illustrated in FIG. 2 and determines that a carrier containing wafers awaiting processing by the tool should be loaded onto the tool. The CTM 22 instructs the dispatcher 24 to dispatch the carrier to the tool 12 via an LP Status notification 64. The dispatcher 24 sends a TxCassetteDeliveryReq signal 66 to the AMHS 26, which issues a Transfer command 68 to the EQP I/O 18. As a result, the carrier is transferred to the tool 12 and loaded into the buffer 14 (FIG. 1) of the tool 12 via the EQP I/O 18.

In a second situation, referred to as "Case 2" and designated by a reference numeral 70, the EQP I/O 18 sends an LP Status notification 72 to the host 20 comprising the CTM 22 indicating that the load ports LP1, LP2, are available. The CTM 22 evaluates the status of the EQP I/O 18 in the manner illustrated in FIG. 2 and determines that the batch stored in the internal buffer (FIG. 1) of the tool 12 should be unloaded before another batch is delivered thereto. In this case 70, the host 20 issues a CarrierOut command 74 to the tool 12, in response to which a CarrierOut action 76 is performed by unloading the batch from the tool via the load ports LP1, LP2.

While the preceding description shows and describes one or more embodiments, it will be understood by those skilled in the art that various changes in form and detail may be made therein without departing from the spirit and scope of the present disclosure. For example, while the present disclosure illustrates the use of a plasma treatment during the fabrication of borderless interconnections, it is understood that the plasma treatment may be utilized in many other fabrication processes. Therefore, the claims should be interpreted in a broad manner, consistent with the present disclosure.

What is claimed is:

1. A method for manufacturing semiconductor devices comprising:
    providing a machine on a semiconductor manufacturing assembly line that performs an action on a semiconductor wafer and that has an internal buffer that provides a location for storing a plurality of semiconductor wafers that are stored together in a wafer carrier;
    providing a host that is operatively coupled with the machine, the host controlling the machine by sending operational commands to the machine, and the host supervising the operation of the machine by receiving machine event notifications from the machine;
    providing a manufacturing execution system communicatively coupled with the host;
    providing a carrier transport system that transports carriers between the machine and a plurality of locations on the semiconductor manufacturing assembly line;
    providing an advanced material handling system that controls the carrier transport system, the advanced material handling system also being communicatively coupled with the host through a dispatcher;
    at the host, receiving information on a first priority of a first carrier of wafers from the manufacturing execution system;
    processing the first carrier of wafers in the machine;
    at the host, receiving a load port status notification message from the machine that indicates whether a load port on the machine is available;
    at the host, inspecting the load port status notification message to determine whether the load port on the machine is available;
    at the host, receiving information from the manufacturing execution system indicating that a second carrier of wafers requires processing on the machine and indicating that the second carrier of wafers has a second priority;
    at the host, analyzing the first priority and the second priority to determine whether the first priority is greater than the second priority;
    if the analyzing step determines that the second priority is greater than the first priority, and if the inspecting step determines that the load port on the machine is available:
    at the host, sending a transport carrier request to the dispatcher of the advanced material handling system to request that the carrier transport system transport the second carrier of wafers to the machine;
    at the dispatcher, responding to the transport carrier request by sending a carrier delivery request command to the advanced material handling system;
    at the advanced material handling system, responding to the carrier delivery request command by causing the carrier transport system to initiate the transport of the second carrier to the machine;
    at the carrier transport system, transporting the second carrier to the machine; and
    at the machine, receiving the second carrier at the load port and into the internal buffer.

2. The method of claim 1 further comprising:
    if the analyzing step determines that the first priority is greater than the second priority, and if the inspecting step determines that the load port on the machine is available:
    at the host, sending a carrier out command to the machine; and at the machine, responding to the carrier out command by unloading the first carrier through the load port on the machine.

3. The method of claim 1 further comprising:

if the buffer status information indicates that the internal buffer of the machine does not have sufficient space to store the second carrier of wafers:

at the host, sending a carrier out command to the machine; and at the machine, responding to the carrier out command by unloading the first carrier through the load port on the machine.

4. The method of claim 1 wherein the carrier transport system is an overhead transport system.

5. The method of claim 1 wherein the carrier delivery request command is a TxCassetteDeliveryReq signal.

6. The method of claim 1 wherein the advanced material handling system further responds to the carrier delivery request command by sending a Transfer command to the load port of the machine.

7. The method of claim 1 further comprising processing a third carrier of wafers in the machine simultaneously with transporting the second carrier to the machine.

8. The method of claim 1 wherein the first carrier and the second carrier are front opening unified pods.

9. The method of claim 1 wherein the plurality of locations on the semiconductor manufacturing assembly line comprise a plurality of process tools for performing a plurality of operations on semiconductor wafers.

10. The method of claim 1 further comprising processing the second carrier of wafers.

11. The method of claim 1 wherein at least by the time of the analyzing step, the first carrier is ready to move and the second carrier is ready to move.

* * * * *